(12) United States Patent
Shimizu

(10) Patent No.: US 12,150,247 B2
(45) Date of Patent: Nov. 19, 2024

(54) BASE TAPE AND SERIES OF ELECTRONIC COMPONENTS

(71) Applicant: Murata Manufacturing Co., Ltd., Nagaokakyo (JP)

(72) Inventor: Yasuhiro Shimizu, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1094 days.

(21) Appl. No.: 17/027,762

(22) Filed: Sep. 22, 2020

(65) Prior Publication Data

US 2021/0105918 A1 Apr. 8, 2021

(30) Foreign Application Priority Data

Oct. 7, 2019 (JP) ................................ 2019-184234

(51) Int. Cl.
  *H05K 13/00* (2006.01)
(52) U.S. Cl.
  CPC .............................. *H05K 13/0084* (2013.01)
(58) Field of Classification Search
  CPC ............... H05K 13/0084; B65D 73/02; B65D 2585/86; B65D 75/327; B65D 2575/361; H01G 4/30
  See application file for complete search history.

(56) References Cited

U.S. PATENT DOCUMENTS

| 2002/0031660 A1* | 3/2002 | Hashizume | B32B 3/02 428/343 |
| 2018/0029783 A1* | 2/2018 | Arai | H01L 23/02 |
| 2021/0127533 A1* | 4/2021 | Shimizu | H05K 13/022 |
| 2021/0144889 A1* | 5/2021 | Shimizu | H05K 13/02 |

FOREIGN PATENT DOCUMENTS

| CN | 2490091 Y | 5/2002 |
| JP | 10-338208 A | 12/1998 |
| JP | 2002-240851 A | 8/2002 |
| JP | 2012-081997 A | 4/2012 |
| JP | 2012-218793 A | 11/2012 |
| JP | 2016-146469 A | 8/2016 |
| JP | 2018-024473 A | 2/2018 |

OTHER PUBLICATIONS

Official Communication issued in corresponding Korean Patent Application No. 10-2020-0127942, mailed on Mar. 23, 2022.
Official Communication issued in corresponding Chinese Patent Application No. 202011037058.5, mailed on May 6, 2022.
Official Communication issued in corresponding Japanese Patent Application No. 2019-184234, mailed on Apr. 5, 2022.

* cited by examiner

*Primary Examiner* — Andrew D Perreault
(74) *Attorney, Agent, or Firm* — Keating & Bennett, LLP

(57) ABSTRACT

A base tape includes a tape main body including a pair of main surfaces opposed to each other and extending in a length direction with a longitudinal direction of the base tape being defined as the length direction and a direction of a short side being defined as a width direction, the tape main body including a plurality of component accommodation portions located at a predetermined distance from each other in the length direction, each of the plurality of component accommodation portions defining and functioning as an accommodation area of an electronic component.

18 Claims, 12 Drawing Sheets

BASE TAPE AND SERIES OF ELECTRONIC COMPONENTS

CROSS REFERENCE TO RELATED APPLICATIONS

This application claims the benefit of priority to Japanese Patent Application No. 2019-184234 filed on Oct. 7, 2019. The entire contents of this application are hereby incorporated herein by reference.

BACKGROUND OF THE INVENTION

1. Field of the Invention

The present invention relates to a base tape and a series of electronic components.

2. Description of the Related Art

A conventional base tape of a series of electronic components is in such a structure that a plurality of accommodation recesses substantially in a parallelepiped shape are provided at regular intervals in a length direction in a belt-shaped tape main body and a large number of substantially annular feed holes are provided at regular intervals in the length direction (see, for example, Japanese Patent Laying-Open No. 2002-240851). When an electronic component is inserted into the accommodation recess in such a base tape from above, two-dimensional positions of the accommodation recess and a yet-to-be-inserted electronic component should be aligned by viewing from above.

In recent years, in order to simplify control of positions with respect to each other at the time of insertion, a method of inserting an electronic component into an accommodation recess in a base tape in a lateral direction (a direction orthogonal to the length direction) has been studied. A base tape as disclosed in Japanese Patent Laid-Open No. 2018-024473 has been proposed as a method of inserting an electronic component in such a lateral direction.

The base tape disclosed in Japanese Patent Laid-Open No. 2018-024473 includes a belt-shaped tape main body and accommodation recesses each having a length, a width, and a depth that allow accommodation of an electronic component, the accommodation recesses being provided in the tape main body at regular intervals in a length direction. This publication discloses such a structure that a guide recess increasing in depth from an upper surface of the tape main body toward one side surface in a width direction of the accommodation recess and continuing to the accommodation recess is provided on one side in the width direction of the accommodation recess in the tape main body.

The base tape disclosed in Japanese Patent Laid-Open No. 2018-024473, however, is provided with the inclined guide recess only in one side of the accommodation recess on a side where a component is inserted. Therefore, when inserting an electronic component having a small clearance with respect to the accommodation recess, the electronic component may get snagged on a corner of a side other than the inclined portion or may ride on the upper surface of the base tape after it gets snagged.

SUMMARY OF THE INVENTION

Preferred embodiments of the present invention provide base tapes that each enable stable insertion in a lateral direction, of an electronic component into an accommodation recess provided therein, and series of electronic components including the base tapes.

A base tape according to a preferred embodiment of the present invention is a base tape that accommodates a plurality of electronic components, and the base tape includes a tape main body including a pair of main surfaces opposed to each other and extending in a length direction with a longitudinal direction of the base tape being defined as the length direction and a direction of a short side being defined as a width direction, the tape main body including a plurality of component accommodation portions provided at a predetermined distance from each other in the length direction, each of the component accommodation portions defining and functioning as an accommodation area of the electronic component. Each of the component accommodation portions includes an accommodation recess including a rectangular or substantially rectangular opening in one main surface of the tape main body, a first inclined portion located on one side of opposed sides in the width direction, of four sides of the opening, the first inclined portion extending from one main surface toward the inside of the accommodation recess to become smaller in height than a side on the other side, and a second inclined portion located on one side of opposed sides in the length direction, the second inclined portion extending from one main surface toward the inside of the accommodation recess to become smaller in height than a side on the other side.

A series of electronic components according a preferred embodiment of to the present invention includes a base tape according to a preferred embodiment of the present invention, an electronic component accommodated in the accommodation recess, and a cover tape that covers a portion of one main surface of the tape main body to close the opening in the accommodation recess where the electronic component is accommodated.

In a base tape according to a preferred embodiment of the present invention, the component accommodation portion includes an accommodation recess including a rectangular or substantially rectangular opening in one main surface of the tape main body, a first inclined portion located on one side of opposed sides in the width direction, of four sides of the opening, the first inclined portion becoming smaller in height toward the inside of the accommodation recess than one main surface, and a second inclined portion located on one side of opposed sides in the length direction, the second inclined portion becoming smaller in height toward the inside of the accommodation recess than one main surface. Therefore, the electronic component is able to be stably inserted while turning of the electronic component with respect to the accommodation recess in the component accommodation portion is significantly reduced or prevented and the electronic component riding over one main surface of the tape main body is significantly reduced or prevented. In addition, the series of electronic components including a base tape is able to be provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 7B is a partially enlarged view of a portion a.

DETAILED DESCRIPTION OF THE PREFERRED EMBODIMENTS

1. First Preferred Embodiment (a) Series of Electronic Components

Figure 1:
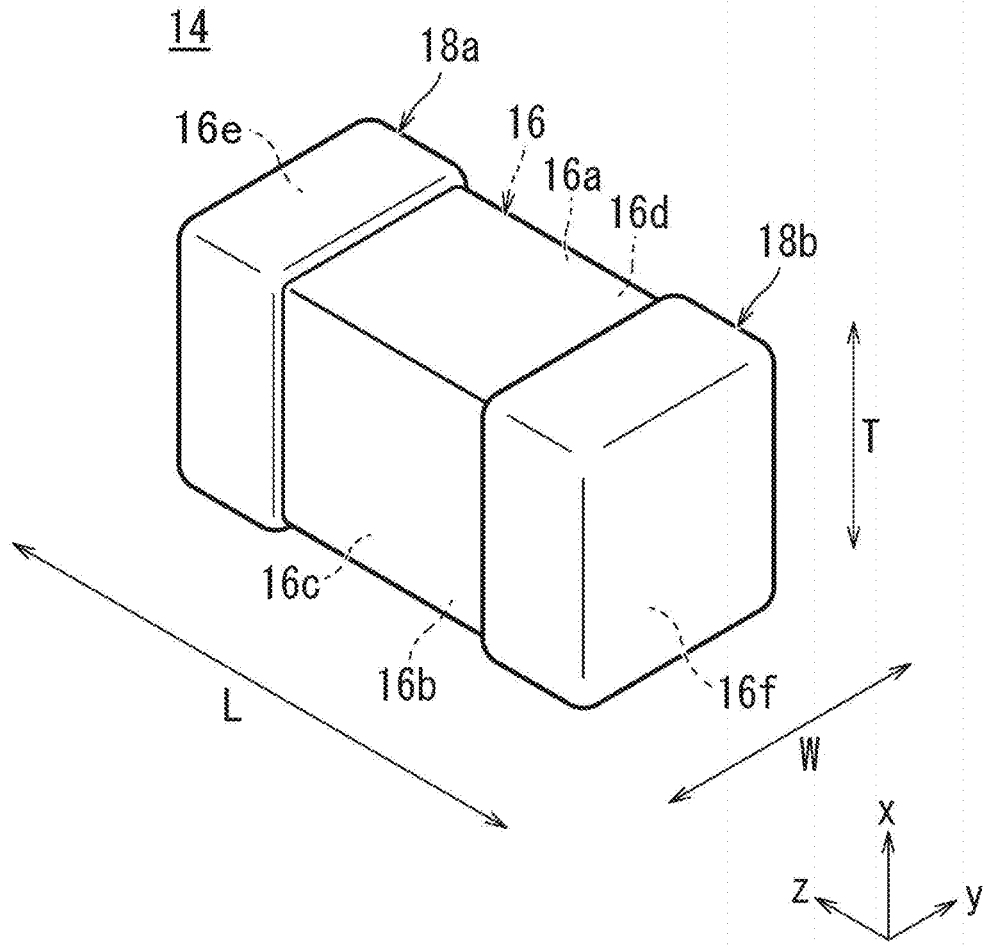
FIG. 1 is a perspective view of an electronic component accommodated in a series of electronic components according to a first preferred embodiment of the present invention.
Figure 2:
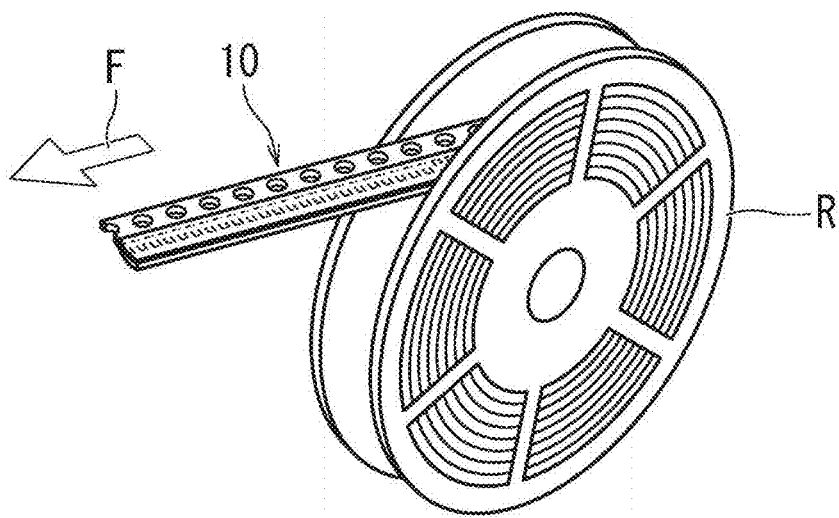
FIG. 2 is a perspective view showing a state that the series of electronic components according to the first preferred embodiment of the present invention is wound around a reel.
Figure 3:
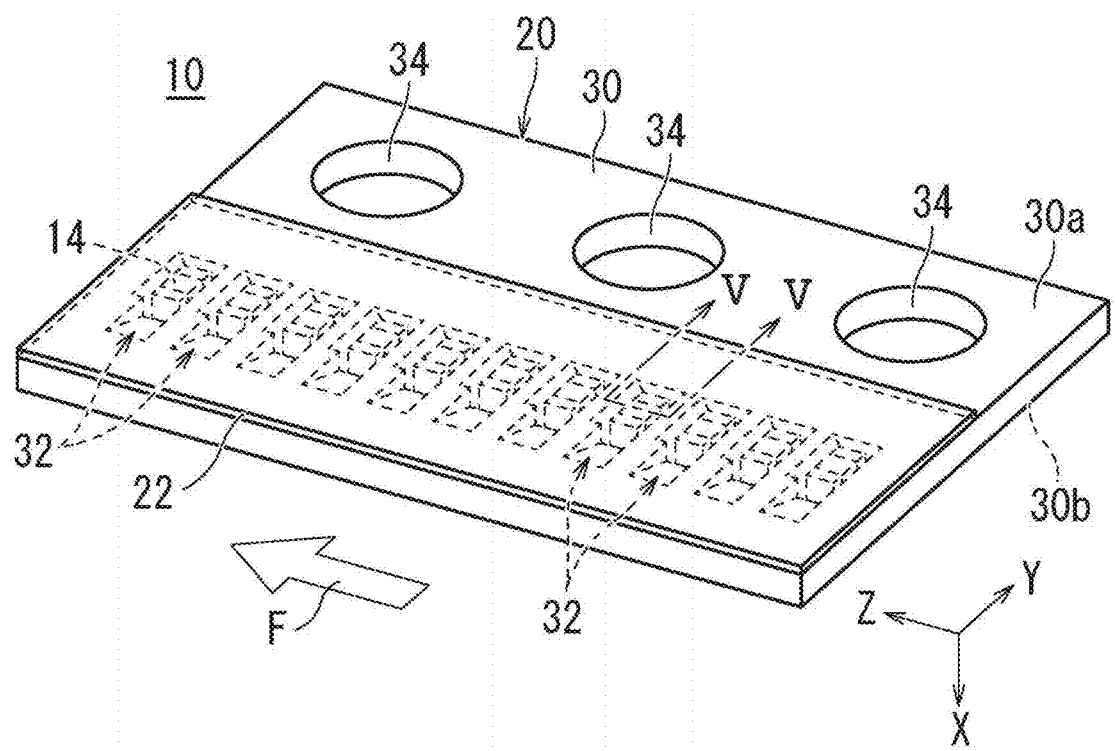
FIG. 3 is a perspective view of the series of electronic components according to the first preferred embodiment of the present invention.
Figure 4:
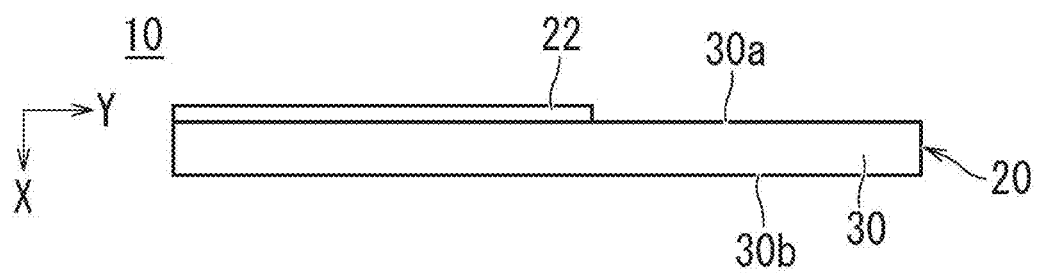
FIG. 4 is a front view showing the series of electronic components according to the first preferred embodiment of the present invention.
Figure 5:
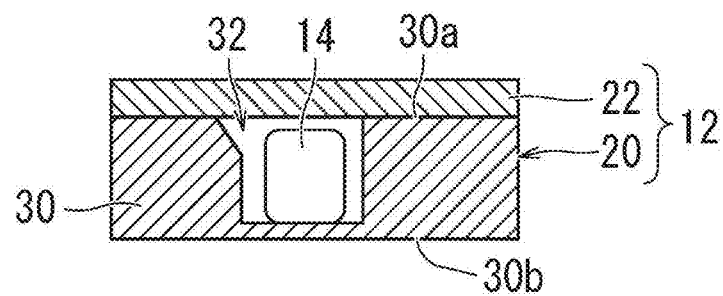
FIG. 5 is a cross-sectional view along the line V-V in FIG. 3.

FIG. 1 is a perspective view of an example of an electronic component accommodated in a series of electronic components according to a first preferred embodiment of the present invention. FIG. 2 is a perspective view showing a state that the series of electronic components according to the first preferred embodiment of the present invention is wound around a reel. FIG. 3 is a perspective view of the series of electronic components according to the first preferred embodiment of the present invention. FIG. 4 is a front view showing the series of electronic components according to the first preferred embodiment of the present invention. FIG. 5 is a cross-sectional view along the line V-V in FIG. 3.

A series of electronic components 10 in the first preferred embodiment includes electronic component taping 12 and an electronic component 14 as shown in FIG. 3. The series of electronic components 10 is wound around a reel R as shown in FIG. 2.

(b) Electronic Component

Electronic component 14 is, for example, a resistor, a capacitor, or an inductor. Initially, a multilayer ceramic electronic component (a multilayer ceramic capacitor) representing an example of an electronic component 14 will be described. FIG. 1 is a perspective view of electronic component 14. FIG. 1 shows a longitudinal direction of a body with L, a width direction of the body with W, and a thickness direction of the body with T.

As shown in FIG. 1, electronic component 14 includes a body 16 having a parallelepiped shape or a substantially parallelepiped shape and an external electrode 18 provided on each of opposing ends of body 16. Body 16 includes a plurality of ceramic layers, and a plurality of internal electrode layers (not shown) embedded in body 16.

Body 16 has a parallelepiped or substantially parallelepiped shape, and includes a first main surface 16a and a second main surface 16b opposed to each other in a height direction x, a first side surface 16c and a second side surface 16d opposed to each other in a width direction y orthogonal or substantially orthogonal to height direction x, and a first end surface 16e and a second end surface 16f opposed to each other in a length direction z orthogonal or substantially orthogonal to height direction x and width direction y.

External electrode 18 is provided on first end surface 16e and second end surface 16f of body 16. External electrode 18 includes a first external electrode 18a and a second external electrode 18b.

First external electrode 18a is provided on a surface of body 16 on a side of first end surface 16e.

Second external electrode 18b is provided on a surface of body 16 on a side of second end surface 16f.

With a dimension in length direction z being defined as an L dimension, electronic component 14 has the L dimension preferably not smaller than about 0.2 mm and not larger than about 1.6 mm, for example. With a dimension in width direction y being defined as a W dimension and a dimension in height direction x being defined as a T dimension, for example, when the L dimension is set to about 1.6 mm, electronic component 14 preferably has the W dimension of about 0.8 mm and the T dimension not smaller than about 0.8 mm and not larger than about 1.6 mm, and, for example, when the L dimension is set to about 0.2 mm, electronic component 14 preferably has the W dimension of about 0.125 mm and the T dimension not smaller than about 0.125 mm and not larger than about 0.2 mm. The T dimension of electronic component 14 is substantially equal to or larger than the W dimension, and the L dimension and the T dimension are close to each other in magnitude. In other words, electronic component 14 preferably has the dimension expressed as W≤T and T≤L and can be considered as an electronic component of a relatively high profile.

(c) Electronic Component Taping

Figure 6:
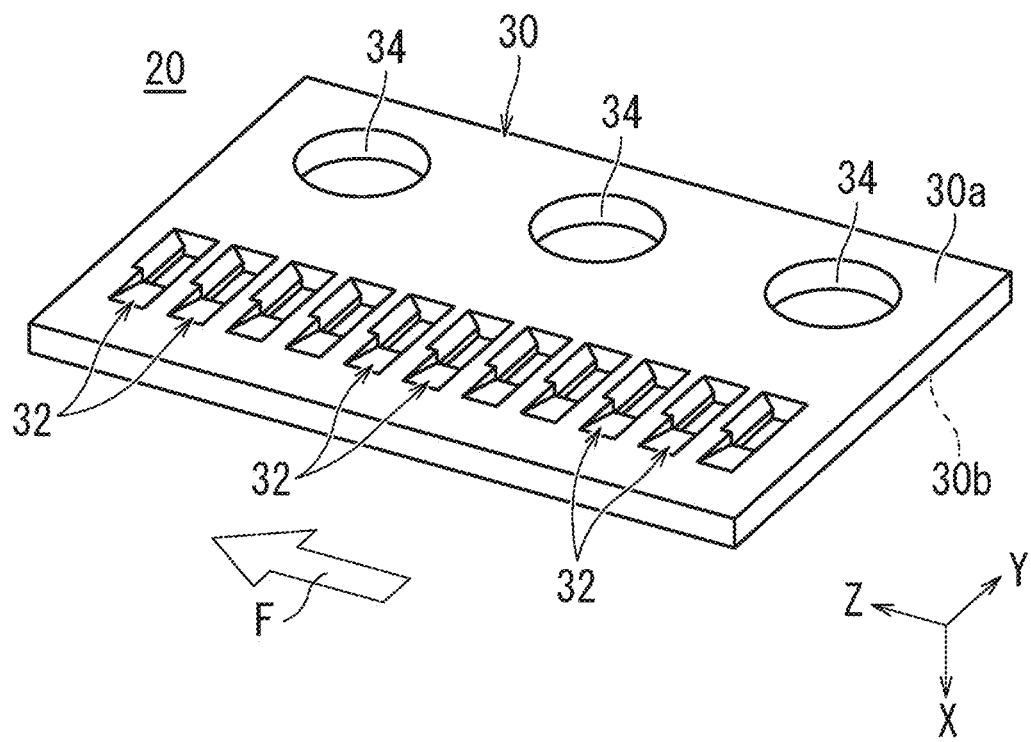
FIG. 6 is a perspective view of a base tape according to the first preferred embodiment of the present invention.
Figure 7A:
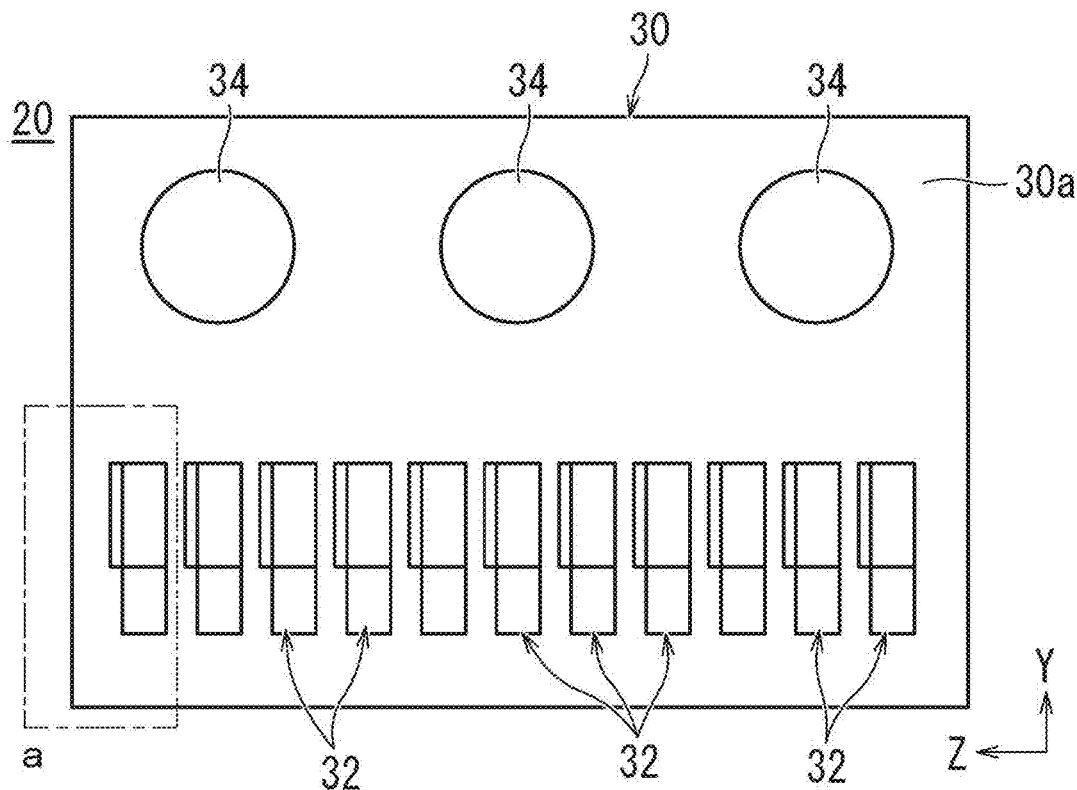
FIG. 7A is a top view of the base tape according to the first preferred embodiment of the present invention.
Figure 7B:
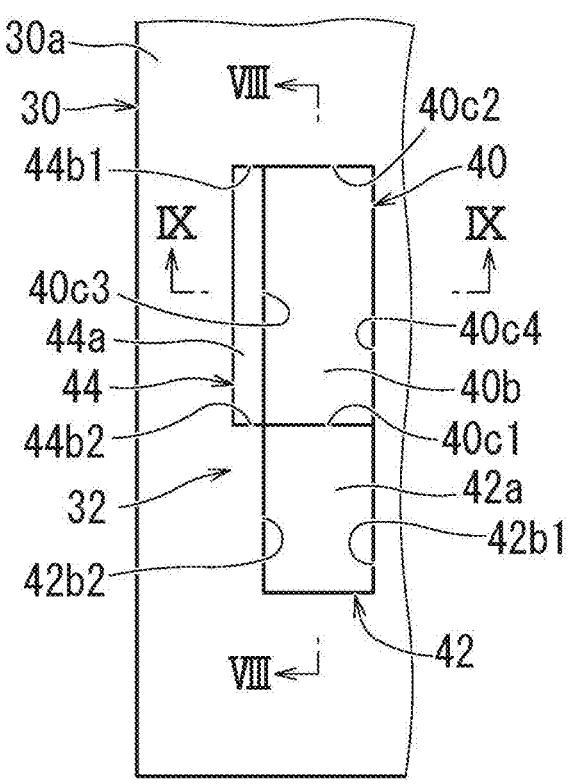
Figure 8:
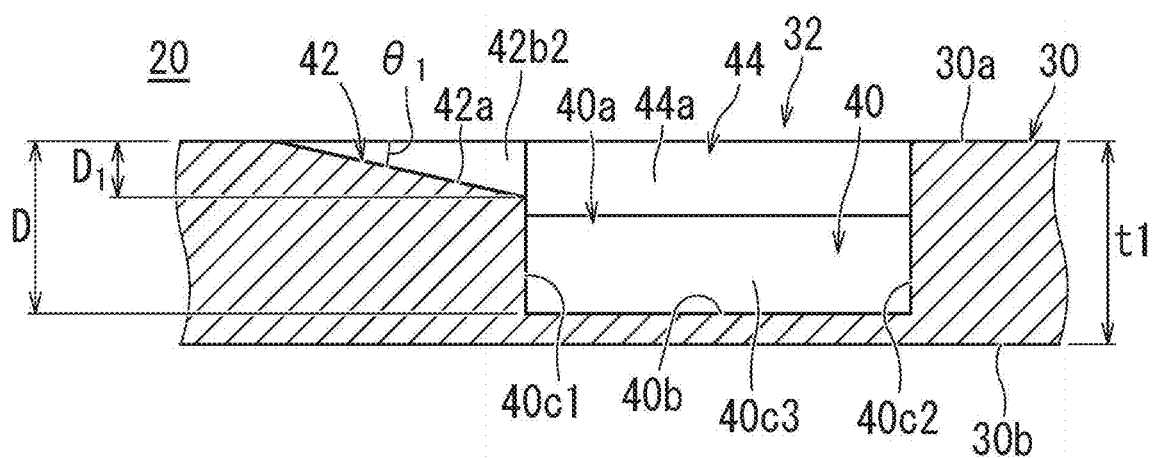
FIG. 8 is a cross-sectional view along the line VIII-VIII in FIG. 7B.
Figure 9:
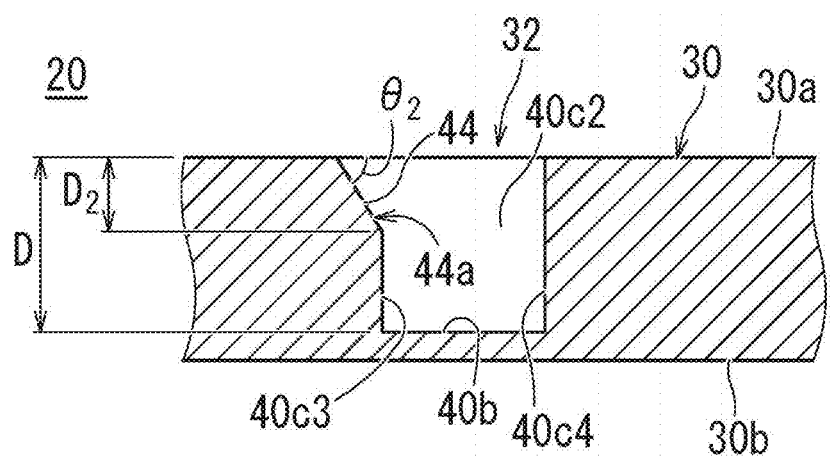
FIG. 9 is a cross-sectional view along the line IX-IX in FIG. 7B.

FIG. 6 is a perspective view of a base tape according to the first preferred embodiment of the present invention. FIG. 7A is a top view of the base tape according to the first preferred embodiment of the present invention. FIG. 7B is a partially enlarged view of a portion a. FIG. 8 is a cross-sectional view along the line VIII-VIII in FIG. 7B. FIG. 9 is a cross-sectional view along the line IX-IX in FIG. 7B.

As shown in FIGS. 3 and 4, electronic component taping 12 includes a base tape 20 in which electronic component 14 is loaded and a cover tape 22 that adheres to at least a portion of an upper surface of base tape 20.

(d) Base Tape

A direction in which base tape 20 extends (the longitudinal direction) is defined as a length direction Z and a direction of a short side thereof is defined as a width direction Y. A direction orthogonal or substantially orthogonal to length direction Z and width direction Y is defined as a vertical direction X. A direction shown with an arrow F which is a direction of feed of base tape 20 in length direction Z is defined as a forward direction.

Base tape 20 according to the first preferred embodiment accommodates a plurality of electronic components 14. Base tape 20 includes a belt-shaped tape main body 30. Tape main body 30 includes a pair of main surfaces 30a and 30b opposed to each other and extending in the length direction. Tape main body 30 has a multi-layered structure including three or more layers of a front surface layer, a rear surface layer, and an intermediate layer between the front surface layer and the rear surface layer. Each layer is preferably made of, for example, a multi-layered cardboard mainly including wood pulp.

Tape main body 30 preferably has a thickness $t_1$ not larger than about 1.1 mm, for example.

Tape main body 30 includes a plurality of component accommodation portions 32 provided at a predetermined distance from each other in length direction Z and each defining and functioning as an accommodation area of electronic component 14. Component accommodation portions 32 are aligned at prescribed intervals in length direction Z of tape main body 30. Component accommodation portions 32 are provided closer to one side in width direction Y of tape main body 30.

Tape main body 30 is provided with feed holes 34 aligned at a predetermined distance from each other in the length direction. Feed holes 34 are closer to the other side in width direction Y of tape main body 30. Feed hole 34 is engaged with a tooth of a sprocket (not shown) that draws the series of electronic components 10 out of reel R.

Component accommodation portion 32 is defined by an accommodation recess 40, a first inclined portion 42 provided on one side of opposed sides in width direction Y of accommodation recess 40, and a second inclined portion 44 provided on one side of opposed sides in length direction Z of accommodation recess 40.

Accommodation recess 40 includes a rectangular or substantially rectangular opening 40a in one main surface 30a. Accommodation recess 40 includes a recess extending from one main surface 30a to the other main surface 30b of tape main body 30 and has a parallelepiped shape or a substantially parallelepiped shape. Accommodation recess 40 has a size that allows accommodation of electronic component 14. More specifically, accommodation recess 40 is defined by a bottom surface 40b and four side surfaces 40c1, 40c2, 40c3, and 40c4. Side surfaces 40c1 and 40c2 are opposed to each other in width direction Y. Side surfaces 40c3 and 40c4 are opposed to each other in length direction Z.

A depth D of accommodation recess 40 refers to a distance from one main surface 30a of tape main body 30 to bottom surface 40b of accommodation recess 40. Depth D of accommodation recess 40 is slightly larger than dimension T in the height direction of electronic component 14. A height of side surface 40c1 of accommodation recess 40 located on one side in width direction Y corresponds to a value calculated by subtracting a maximum value of a depth $D_1$ of first inclined portion 42 from depth D of accommodation recess 40. A height of side surface 40c2 in accommodation recess 40 located on the other side in width direction Y is equal or substantially equal to depth D of accommodation recess 40. A height of side surface 40c3 in accommodation recess 40 located on one side in length direction Z corresponds to a value calculated by subtracting a maximum value of a depth $D_2$ of second inclined portion 44 from depth D of accommodation recess 40. A height of side surface 40c4 of accommodation recess 40 located on the other side in length direction Z is equal or substantially equal to depth D of accommodation recess 40.

First inclined portion 42 guides electronic component 14 into accommodation recess 40. First inclined portion 42 includes a first inclined surface 42a and two side surfaces 42b1 and 42b2. Side surfaces 42b1 and 42b2 are opposed to each other in length direction Z.

First inclined portion 42 decreases in height toward side surface 40c1 on one side of opposed sides in width direction Y of four sides of opening 40a in accommodation recess 40 and from one main surface 30a of tape main body 30 toward the inside (toward bottom surface 40b) of accommodation recess 40. In other words, first inclined portion 42 increases in depth $D_1$ toward side surface 40c1 on one side in width direction Y of four sides of opening 40a in accommodation recess 40 and continues to side surface 40c1 of accommodation recess 40. A gradient of first inclined portion 42 is expressed with $\theta_1$. Gradient $\theta_1$ of first inclined portion 42 is an angle between first inclined surface 42a and one main surface 30a of tape main body 30. Gradient $\theta_1$ of first inclined portion 42 is preferably not smaller than about five degrees and not larger than about seventy degrees, for example.

Second inclined portion 44 more stably guides electronic component 14 into accommodation recess 40 when electronic component 14 is guided by first inclined portion 42 and inserted in accommodation recess 40. Second inclined portion 44 includes a second inclined surface 44a and two side surfaces 44b1 and 44b2. Side surfaces 44b1 and 44b2 are opposed to each other in width direction Y.

Second inclined portion 44 decreases in height toward side surface 40c3 on one side of opposed sides in length direction Z of four sides of opening 40a in accommodation recess 40 and from one main surface 30a of tape main body 30 toward the inside (toward bottom surface 40b) of accommodation recess 40. In other words, second inclined portion 44 increases in depth $D_2$ toward side surface 40c3 on one side in length direction Z of four sides of opening 40a in accommodation recess 40 and continues to side surface 40c3 of accommodation recess 40. A gradient of second inclined portion 44 is expressed with $\theta_2$. Gradient $\theta_2$ of second inclined portion 44 is an angle between second inclined surface 44a and one main surface 30a of tape main body 30. Gradient $\theta_2$ of second inclined portion 44 is preferably not smaller than about five degrees and not larger than about seventy degrees, for example.

A maximum value of depth $D_1$ of first inclined portion 42 preferably satisfies a condition of $2 \times D_1 \leq D$, for example. A maximum value of depth $D_2$ of second inclined portion 44 preferably satisfies a condition of $2 \times D_2 \leq D$, for example. The center of gravity of electronic component 14 is located at a position generally not more than about D/2 in height. Therefore, by setting a depth of each of inclined portions 42 and 44 to a value substantially equal to or smaller than about half depth D of accommodation recess 40, turning of electronic component 14 in accommodation recess 40 after electronic component 14 is accommodated in accommodation recess 40 is able to be significantly reduced or prevented while a clearance is large enough at the time of insertion of electronic component 14.

Depth $D_1$ of first inclined portion 42 and depth $D_2$ of second inclined portion 44 preferably satisfy a condition of $D_1 \leq D_2$, for example. Gradient $\theta_1$ of first inclined portion 42 and gradient $\theta_2$ of second inclined portion 44 preferably satisfy a condition of $\theta_1 \leq \theta_2$, for example. Since force by which electronic component 14 is pushed into accommodation recess 40 is applied in first inclined portion 42 as in an air insertion method, an angle of inclination may be small. In second inclined portion 44, however, force by air is not applied. Therefore, an angle sufficient to allow accommodation of an electronic component into accommodation recess 40 only by gravity applied to the electronic component is preferably set for second inclined portion 44, for example.

(e) Cover Tape

Cover tape 22 is bonded onto one main surface 30a of tape main body 30 of base tape 20 to cover an upper end opening including opening 40a in accommodation recess 40 in each of a plurality of component accommodation portions 32 after electronic components 14 are accommodated in accommodation recesses 40 in component accommodation portions 32 of base tape 20. Cover tape 22 is closer to one side in width direction Y of tape main body 30, and accordingly does not cover feed holes 34.

Cover tape 22 is preferably transparent or semitransparent, and a state of accommodation of electronic component 14 is able to be externally checked, for example. Cover tape 22 may be heat sensitive or pressure sensitive.

Cover tape 22 has a belt shape in the present preferred embodiment. In order to increase an area of contact between base tape 20 and cover tape 22, however, cover tape 22 may have a corrugated shape with a recess along feed hole 34 and a protrusion provided between adjacent feed holes 34 in a plan view.

(f) Method of Inserting Electronic Component

A non-limiting example of a method of inserting electronic component 14 into component accommodation portion 32 of base tape 20 in a lateral direction (a direction from one side toward the other side in width direction Y of base tape 20) is now shown. This insertion method is by way of example and the method of inserting electronic component 14 into component accommodation portion 32 of base tape 20 in the lateral direction is not restricted thereto.

Figure 10A:
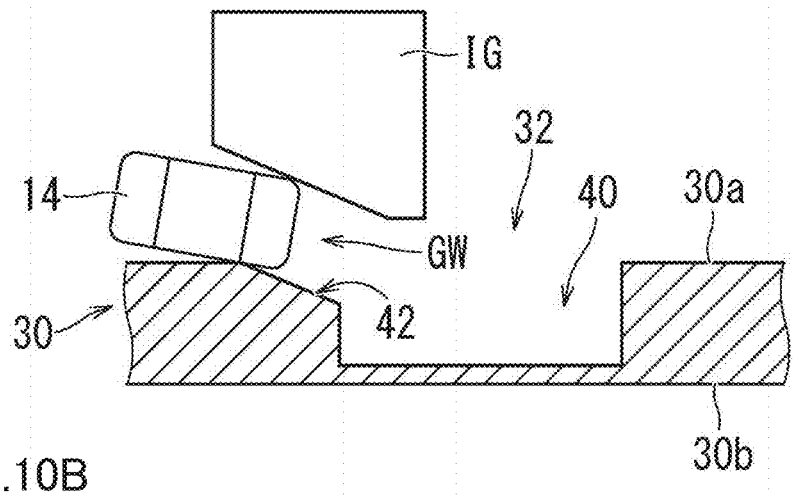
FIGS. 10A to 10C are diagrams showing a method of inserting an electronic component in a lateral direction into a component accommodation portion of the base tape shown in FIG. 6.
Figure 10B:
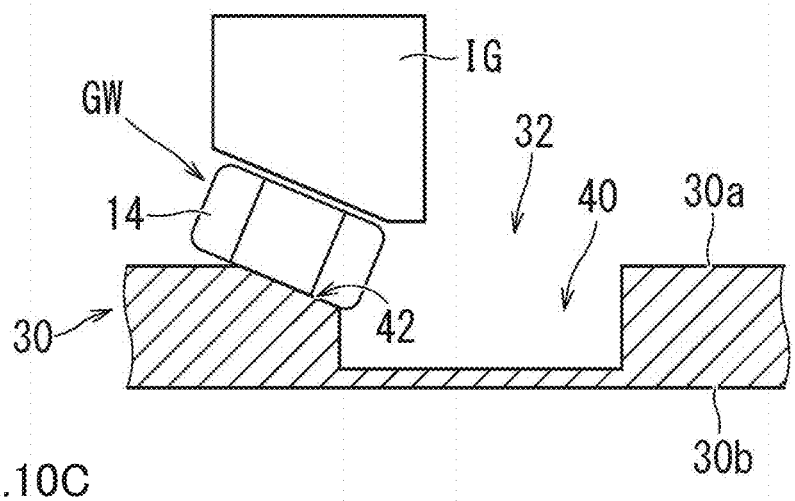
Figure 10C:
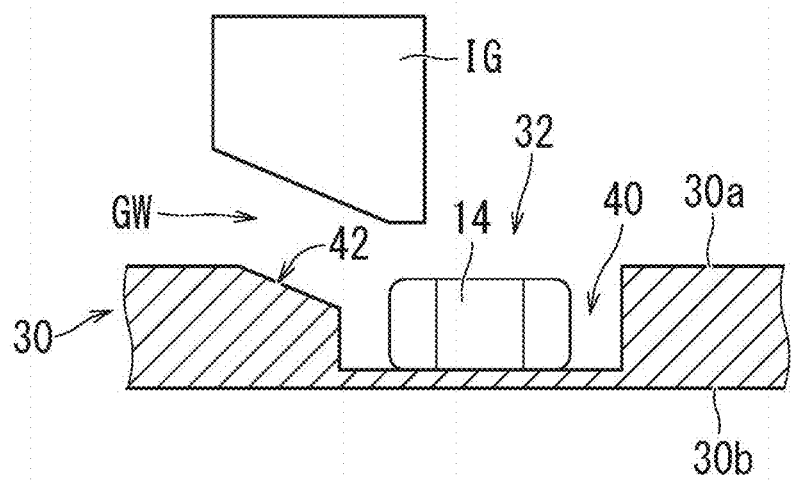

FIGS. 10A to 10C are diagrams showing a method of inserting an electronic component in the lateral direction into the component accommodation portion of the base tape shown in FIG. 6.

Initially, as shown in FIG. 10A, a lower surface of an insertion guide IG is provided above base tape 20, and accordingly does not interfere with intermittent movement of base tape 20 in the length direction. The lower surface of insertion guide IG is opposed to the upper surface of base tape 20 with a clearance that significantly reduces or prevents displacement of base tape 20 in vertical direction X. More specifically, the lower surface of insertion guide IG is opposed to first inclined surface 42a of first inclined portion 42. A space between the lower surface of insertion guide IG and first inclined surface 42a of first inclined portion 42 defines and functions as a component passage GW.

As shown in FIG. 10A, in inserting electronic component 14 into accommodation recess 40 in base tape 20 in the lateral direction, a ball feeder (not shown) feeds aligned electronic components 14 into component passage GW through a linear feeder (not shown).

In succession, as shown in FIG. 10B, electronic component 14 fed into component passage GW is slid in accordance with the inclination of first inclined surface 42a of first inclined portion 42 and fed into accommodation recess 40. Since second inclined portion 44 is provided and the opening of component accommodation portion 32 is wide open at this time, component accommodation portion 32 is able to smoothly feed electronic component 14 into accommodation recess 40.

As shown in FIG. 10C, electronic component 14 fed into accommodation recess 40 is inclined and second main surface 16b of electronic component 14 is in contact with bottom surface 40b of accommodation recess 40 when a tip end thereof comes in contact with side surface 40c2, and electronic component 14 is then inserted in accommodation recess 40. At this time, when the maximum value of depth $D_1$ of first inclined portion 42 satisfies the condition of $2 \times D_1 \leq D$ and the maximum value of depth $D_2$ of second inclined portion 44 satisfies the condition of $2 \times D_2 \leq D$, turning of electronic component 14 in accommodation recess 40 after electronic component 14 is accommodated in accommodation recess 40 is able to be significantly reduced or prevented while the clearance is large enough at the time of insertion of electronic component 14.

Figure 11A:
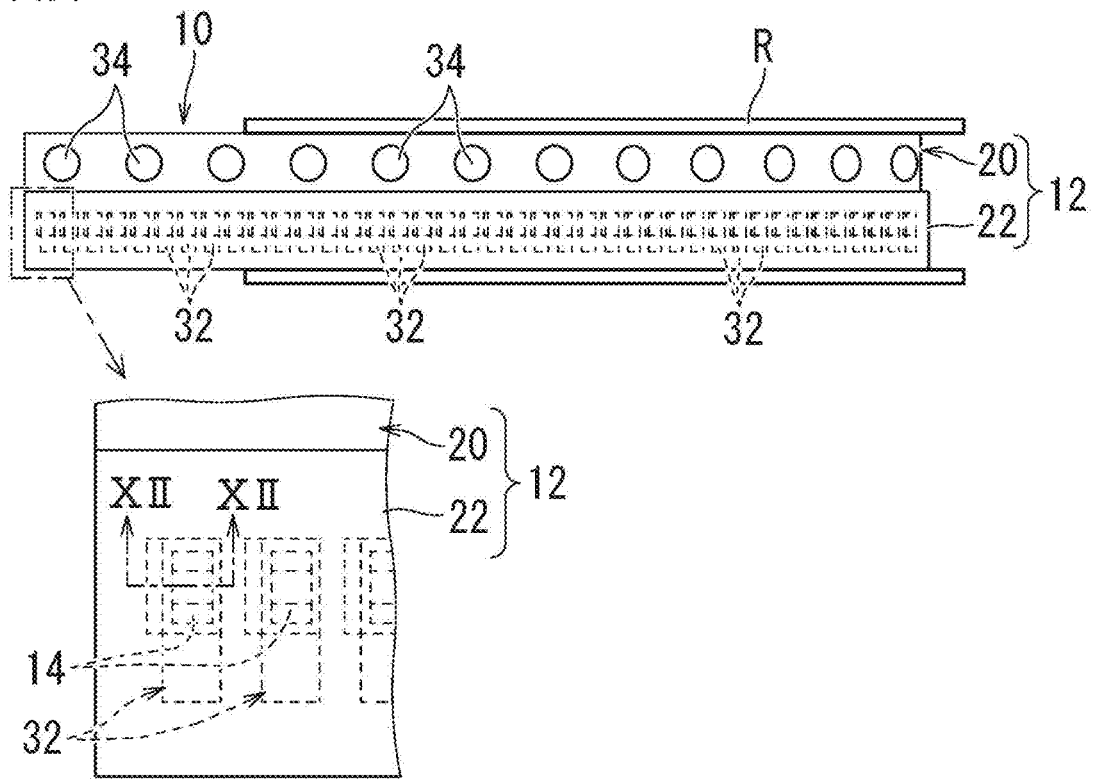
FIG. 11A is a top view of a state of feed of the series of electronic components from the reel.
Figure 11B:
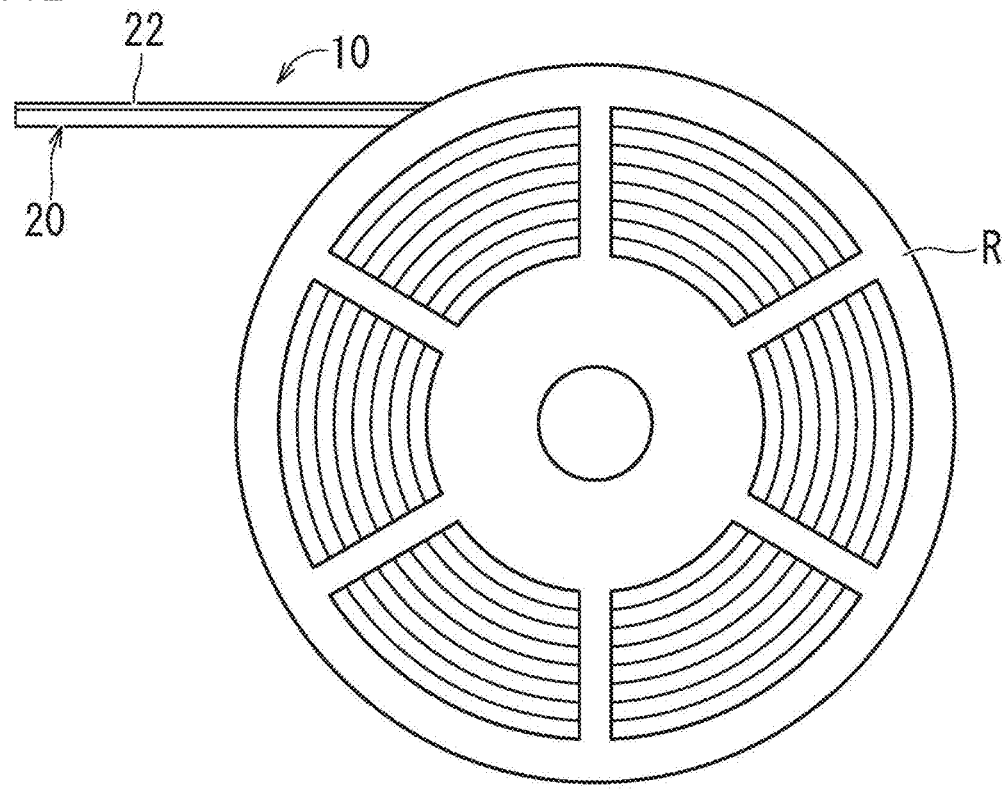
FIG. 11B is a side view of the state of feed of the series of electronic components from the reel.
Figure 12:
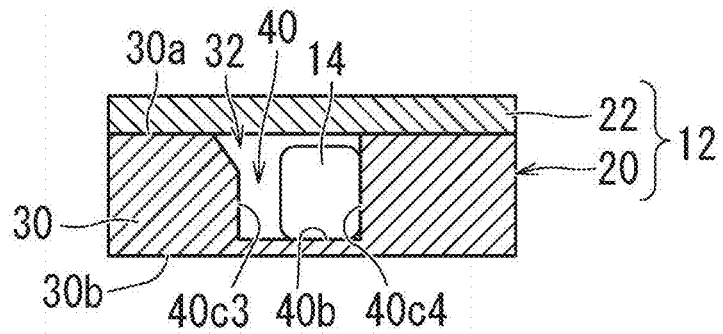
FIG. 12 is a cross-sectional view along the line XII-XII in FIG. 11A.

A state of feed of a series of electronic components 10 from reel R will now be described. FIG. 11A is a top view of a state of feed of the series of electronic components from reel R. FIG. 11B is a side view of that state. FIG. 12 is a cross-sectional view along the line XII-XII in FIG. 11A.

At rest, electronic component 14 is provided in a portion intermediate in the length direction in the inside of accommodation recess 40 as shown in FIG. 5. When the series of electronic components 10 is drawn in a direction shown with arrow F which is a direction of feed of the tape, inertial force is applied to electronic component 14 provided in accommodation recess 40 as shown in FIG. 12 and electronic component 14 is pressed against side surface 40c4. Specifically, as inertial force as described above is applied to electronic component 14 at the time when cover tape 22 is peeled off, for example, in loading reel R around which series of electronic components 10 according to the present preferred embodiment is wound into a tape feeder of a mounter, electronic component 14 is pressed against side surface 40c4. Since no inclined portion is provided on the side of side surface 40c4 in accommodation recess 40 in base tape 20 according to the present preferred embodiment, however, electronic component 14 is able to be stably provided in accommodation recess 40.

According to base tape 20 shown in FIG. 6, component accommodation portion 32 includes accommodation recess 40 including rectangular or substantially rectangular opening 40a in one main surface 30a of tape main body 30, first inclined portion 42 located on one side of opposed sides in width direction Y of four sides of opening 40a, the first inclined portion extending from one main surface 30a toward the inside of accommodation recess 40 to become smaller in height than a side on the other side, and second inclined portion 44 located on one side of opposed sides in length direction Z, the second inclined portion extending from one main surface 30a toward the inside of accommodation recess 40 to become smaller in height than a side on the other side. Therefore, electronic component 14 is able to be stably inserted into accommodation recess 40 in component accommodation portion 32 while turning of electronic component 14 is significantly reduced or prevented and the electronic component riding over one main surface 30a of tape main body 30 is significantly reduced or prevented.

(g) Modification of Base Tape

Figure 13:
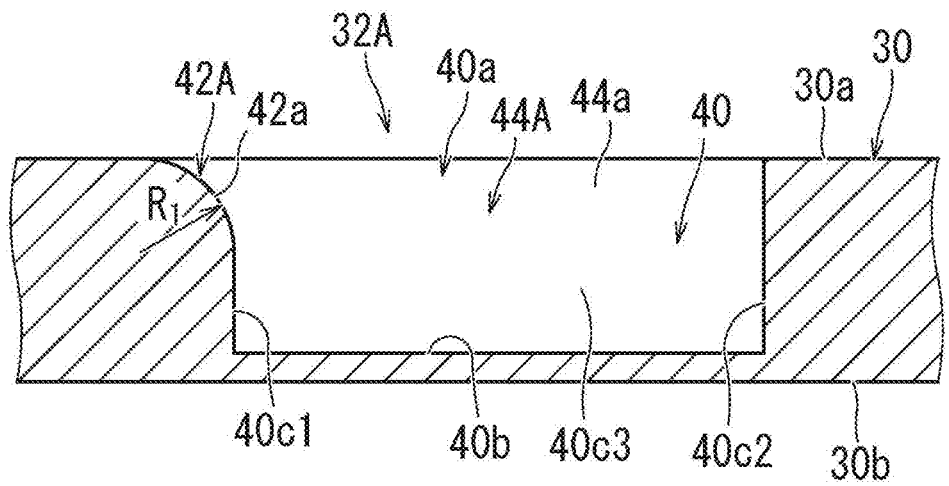
FIG. 13 is a diagram corresponding to FIG. 8, of a base tape according to a modification of the first preferred embodiment of the present invention.
Figure 14:
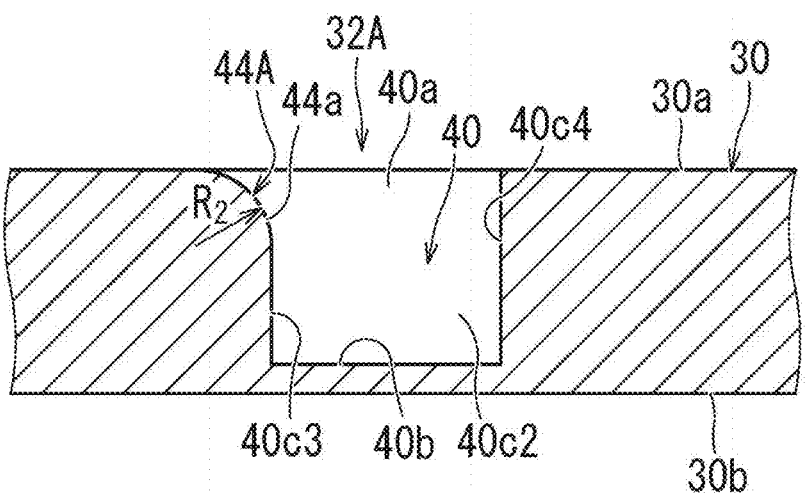
FIG. 14 is a diagram corresponding to FIG. 9, of the base tape according to the modification of the first preferred embodiment of the present invention.

A modification of component accommodation portion 32 of base tape 20 in the first preferred embodiment of the present invention will now be described. FIG. 13 is a diagram corresponding to FIG. 8, of a base tape according to the modification of the first preferred embodiment of the present invention. FIG. 14 is a diagram corresponding to FIG. 9, of the base tape according to the modification of the first preferred embodiment of the present invention.

A component accommodation portion 32A according to the modification of the first preferred embodiment is defined by accommodation recess 40, a first inclined portion 42A provided on one side of opposed sides in width direction Y of accommodation recess 40, and a second inclined portion 44A provided on one side of opposed sides in length direction Z of accommodation recess 40.

First inclined portion 42A guides electronic component 14 into accommodation recess 40. First inclined portion 42A includes first inclined surface 42a and two side surfaces. The side surfaces are opposed to each other in length direction Z.

As shown in FIG. 13, first inclined portion 42A decreases in height toward side surface 40c1 on one side of opposed sides in width direction Y of four sides of opening 40a in accommodation recess 40 and from one main surface 30a of tape main body 30 toward the inside (toward bottom surface 40b) of accommodation recess 40. In other words, first inclined portion 42A increases in depth $D_1$ toward side surface 40c1 on one side in width direction Y of four sides of opening 40a in accommodation recess 40 and continues to side surface 40c1 of accommodation recess 40. First inclined surface 42a of first inclined portion 42A is a curved surface having a radius of curvature $R_1$.

As shown in FIG. 14, second inclined portion 44A more stably guides electronic component 14 to accommodation recess 40 when electronic component 14 is inserted into accommodation recess 40 as being guided by first inclined portion 42A. First inclined portion 44A includes second inclined surface 44a and two side surfaces. The side surfaces are opposed to each other in width direction Y.

Second inclined portion 44A decreases in height toward side surface 40c3 on one side opposed in length direction Z of four sides of opening 40a in accommodation recess 40 and from one main surface 30a of tape main body 30 toward the inside (toward bottom surface 40b) of accommodation recess 40. In other words, second inclined portion 44A increases in depth $D_2$ toward side surface 40c3 on one side in length direction Z of four sides of opening 40a in accommodation recess 40 and continues to side surface 40c3 of accommodation recess 40. Second inclined surface 44a of second inclined portion 44A is a curved surface having a radius of curvature $R_2$.

A relationship between radius of curvature $R_1$ of first inclined surface 42a and radius of curvature $R_2$ of second inclined surface 44a preferably satisfy a condition of $R_2 \leq R_1$ for example. A relationship among radius of curvature $R_1$ of first inclined surface 42a, radius of curvature $R_2$ of second inclined surface 44a, and depth D of accommodation recess 40 preferably satisfy a condition of $2 \times R_2 \leq 2 \times R_1 \leq D$, for example.

Base tape 20 including component accommodation portion 32A according to the modification of the first preferred embodiment shown in FIGS. 13 and 14 provides an advantageous effect the same as or similar to an advantageous effect provided by base tape 20 including component accommodation portion 32 according to the first preferred embodiment.

2. Second Preferred Embodiment

A series of electronic components according to a second preferred embodiment of the present invention will now be described. A series of electronic components in the second preferred embodiment is similar in construction to the series of electronic components 10 except that a component accommodation portion 132 of a tape main body 130 in a base tape 120 is different in construction from component accommodation portion 32 of tape main body 30 in base tape 20 of the series of electronic components 10 in the first preferred embodiment. Therefore, elements identical or similar to those in the series of electronic components 10 are denoted by the same reference characters and description thereof will not be provided.

Figure 15:
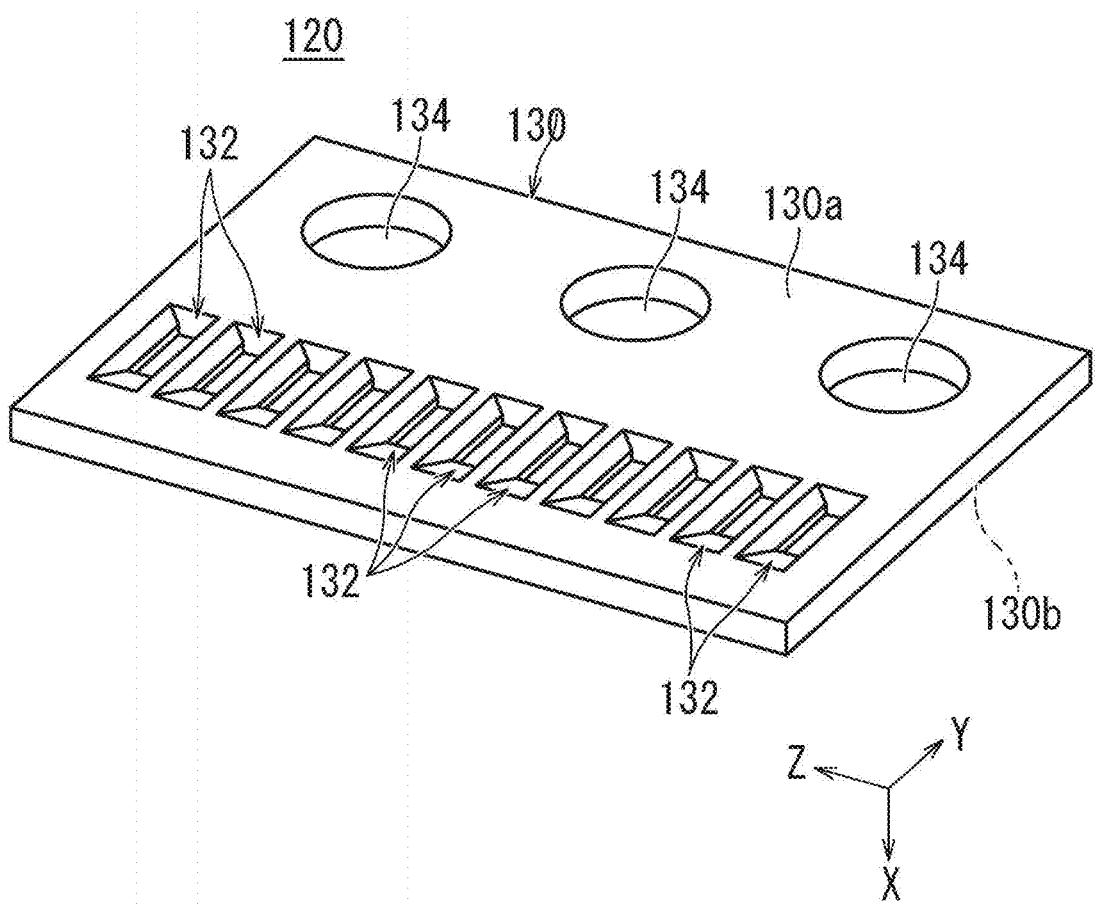
FIG. 15 is a perspective view of a base tape in a series of electronic components according to a second preferred embodiment of the present invention.
Figure 16A:
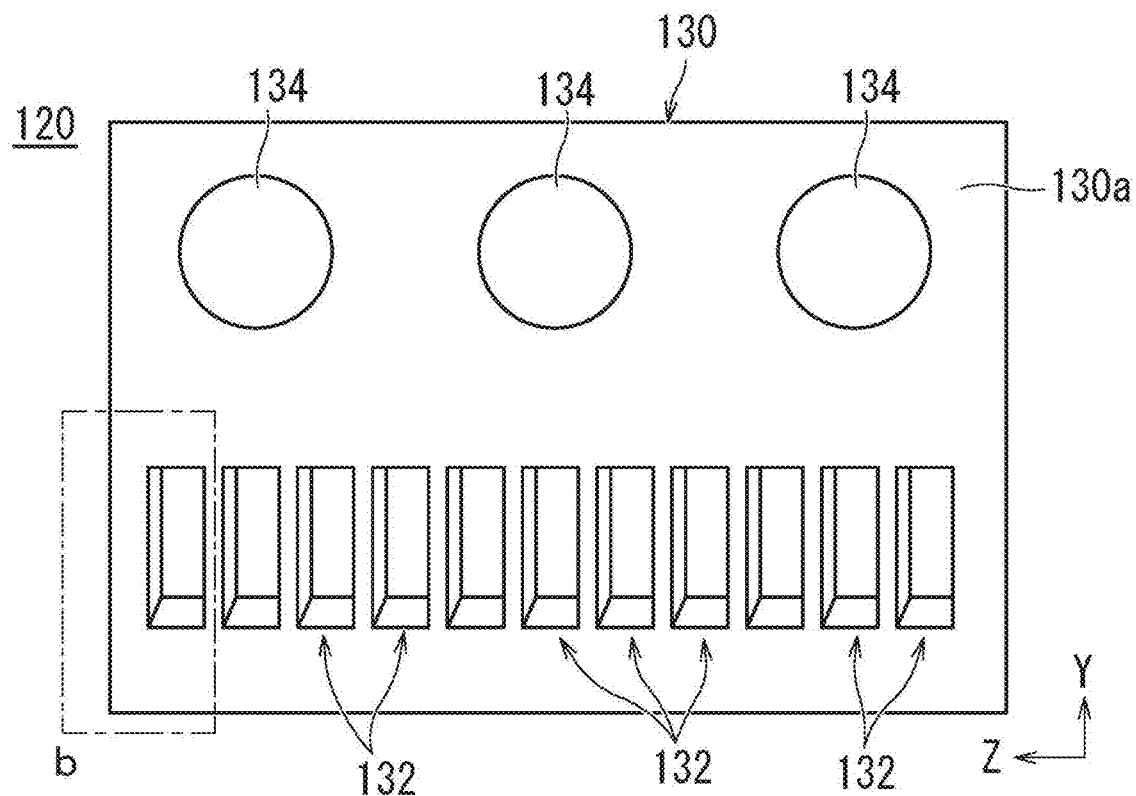
FIG. 16A is a top view of the base tape in the series of electronic components according to the second preferred embodiment of the present invention.
Figure 16B:
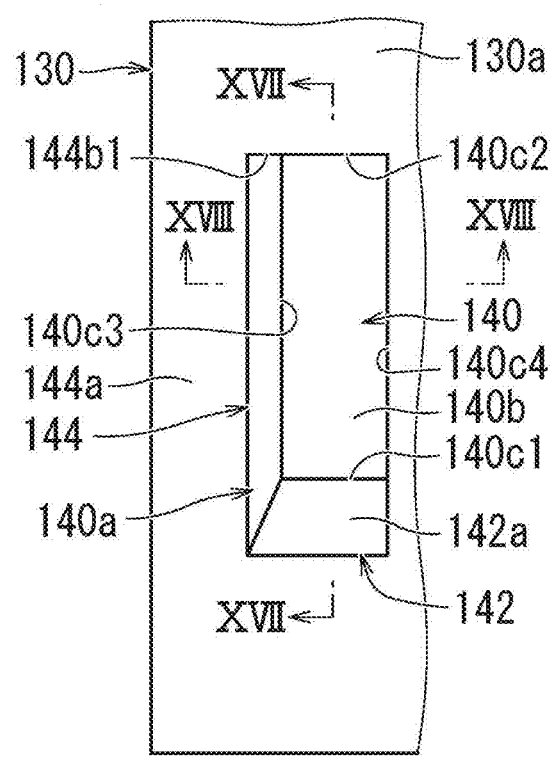
FIG. 16B is a partially enlarged view of a portion b.
Figure 17:
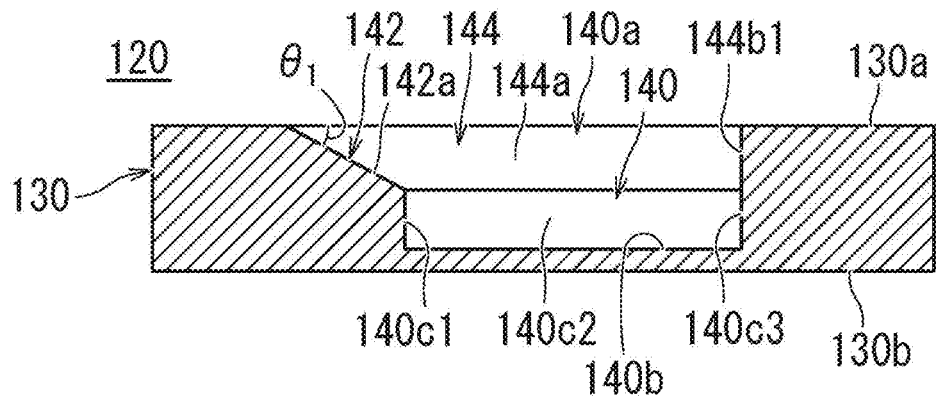
FIG. 17 is a cross-sectional view along the line XVII-XVII in FIG. 16B.
Figure 18:
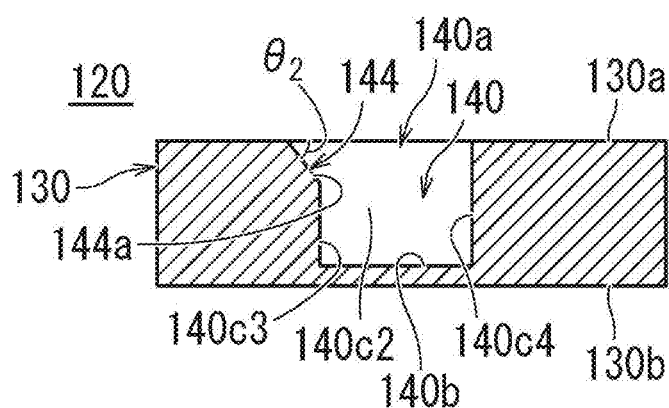
FIG. 18 is a cross-sectional view along the line XVIII-XVIII in FIG. 16B.

FIG. 15 is a perspective view of the base tape in the series of electronic components according to the second preferred embodiment of the present invention. FIG. 16A is a top view of the base tape in the series of electronic components according to the second preferred embodiment of the present invention. FIG. 16B is a partially enlarged view of a portion b. FIG. 17 is a cross-sectional view along the line XVII-XVII in FIG. 16B. FIG. 18 is a cross-sectional view along the line XVIII-XVIII in FIG. 16B.

Base tape 120 accommodates a plurality of electronic components 14. Base tape 120 includes belt-shaped tape main body 130. Tape main body 130 includes a pair of main surfaces 130a and 130b opposed to each other and extending in the length direction. Tape main body 130 has a multi-layered structure including three or more layers of a front surface layer, a rear surface layer, and an intermediate layer lying between the front surface layer and the rear surface layer. Each layer is made of, for example, a multi-layered cardboard mainly including wood pulp.

Tape main body 130 includes a plurality of component accommodation portions 132 at a predetermined distance from each other in length direction Z and each defining and functioning as an accommodation area of electronic component 14. Component accommodation portions 132 are aligned at prescribed intervals in length direction Z of tape main body 130. Component accommodation portions 132 are closer to one side in width direction Y of tape main body 130.

Tape main body 130 is provided with feed holes 134 aligned at a predetermined distance from each other in the length direction. Feed holes 134 are closer to the other side in width direction Y of tape main body 130. Feed hole 134 is engaged with a tooth of a sprocket (not shown) that draws the series of electronic components out of reel R.

Component accommodation portion 132 is defined by an accommodation recess 140, a first inclined portion 142 provided on one side of opposed sides in width direction Y of accommodation recess 140, and a second inclined portion 144 provided on one side of opposed sides in length direction Z of accommodation recess 140.

Accommodation recess 140 includes a rectangular or substantially rectangular opening 140a in one main surface 130a. Accommodation recess 140 includes a recess extending from one main surface 130a to the other main surface 130b of tape main body 130 and a parallelepiped shape or a substantially parallelepiped shape. Accommodation recess 140 has a size that allows accommodation of electronic component 14. More specifically, accommodation recess 140 is defined by a bottom surface 140b and four side surfaces 140c1, 140c2, 140c3, and 140c4. Side surfaces 140c1 and 140c2 are opposed to each other in width direction Y. Side surfaces 140c3 and 140c4 are opposed to each other in length direction Z.

A depth D of accommodation recess 140 refers to a distance from one main surface 130a of tape main body 130 to bottom surface 140b of accommodation recess 140. Depth D of accommodation recess 140 is slightly larger than dimension T in the height direction of electronic component 14. A height of side surface 140c1 in accommodation recess 140 located on one side in width direction Y corresponds to a value calculated by subtracting a maximum value of depth $D_1$ of first inclined portion 142 from depth D of accommodation recess 140. A height of side surface 140c2 in accommodation recess 140 located on the other side in width direction Y is equal or substantially equal to depth D of accommodation recess 140. A height of side surface 140c3 in accommodation recess 140 located on one side in length direction Z corresponds to a value calculated by subtracting a maximum value of depth $D_2$ of second inclined portion 144 from depth D of accommodation recess 140. A height of side surface 140c4 in accommodation recess 140 located on the other side in length direction Z is equal or substantially equal to depth D of accommodation recess 140.

First inclined portion 142 guides electronic component into accommodation recess 140. First inclined portion 142 includes a first inclined surface 142a and a side surface 140c1.

First inclined portion 142 decreases in height toward side surface 140c1 on one side of opposed sides in width direction Y of four sides of opening 140a in accommodation recess 140 and from one main surface 130a of tape main body 130 toward the inside (toward bottom surface 140b) of accommodation recess 140. In other words, first inclined portion 142 increases in depth $D_1$ toward side surface 140c1 on one side in width direction Y of four sides of opening 140a in accommodation recess 140 and continues to side surface 140c1 of accommodation recess 140. A gradient of first inclined portion 142 is expressed with $\theta_1$. Gradient $\theta_1$ of first inclined portion 142 is an angle between first inclined surface 142a and one main surface 130a of tape main body 130. Gradient $\theta_1$ of first inclined portion 142 is preferably not smaller than about five degrees and not larger than about seventy degrees, for example. First inclined surface 142a of first inclined portion 142 is provided to be in direct contact with second inclined surface 144a of second inclined portion 144 which will be described later. At this time, first inclined surface 142a has a trapezoidal shape or substantially trapezoidal shape.

Second inclined portion 144 more stably guides electronic component 14 into accommodation recess 140 when electronic component 14 is inserted in accommodation recess 140 as being guided by first inclined portion 142. Second inclined portion 144 includes a second inclined surface 144a and a side surface 144b1.

Second inclined portion 144 decreases in height toward side surface 140c3 on one side opposed in length direction Z of four sides of opening 140a in accommodation recess 140 and from one main surface 130a of tape main body 130 toward the inside (toward bottom surface 140b) of accommodation recess 140. In other words, second inclined portion 144 increases in depth $D_2$ toward side surface 140c3 on one side in length direction Z of four sides of opening 140a in accommodation recess 140 and continues to side surface 140c3 of accommodation recess 140. A gradient of second inclined portion 144 is expressed with $\theta_2$. Gradient $\theta_2$ of second inclined portion 144 is an angle between second inclined surface 144a and one main surface 130a of tape main body 130. Gradient $\theta_2$ of second inclined portion 144 is preferably not smaller than about five degrees and not larger than about seventy degrees, for example. Second inclined surface 144a of second inclined portion 144 is provided to be in direct contact with first inclined surface 142a of first inclined portion 142. At this time, second inclined surface 144a has a trapezoidal shape or substantially trapezoidal shape.

A maximum value of depth $D_1$ of first inclined portion 142 preferably satisfies a condition of $2 \times D_1 \leq D$, for example. A maximum value of depth $D_2$ of second inclined portion 144 preferably satisfies a condition of $2 \times D_2 \leq D$, for example.

Depth $D_1$ of first inclined portion 142 and depth $D_2$ of second inclined portion 144 preferably satisfy a condition of $D_1 \leq D_2$, for example. Gradient $\theta_1$ of first inclined portion 142 and gradient $\theta_2$ of second inclined portion 144 preferably satisfy a condition of $\theta_1 \leq \theta_2$, for example.

Base tape 110 according to the second preferred embodiment provides an advantageous effect similar to an advantageous effect provided by base tape 10 according to the first preferred embodiment and also provides an advantageous effect described below. Specifically, electronic component 14 is able to be more smoothly inserted in accommodation recess 140 without abutment of a component onto a corner of first inclined portion 142 and second inclined portion 144.

3. Another Preferred Embodiment

Although tape main body 30 of base tape 20 according to the first preferred embodiment or tape main body 130 of base tape 120 according to the second preferred embodiment has a multi-layered structure including three or more layers and each layer is made of a multi-layered cardboard mainly including wood pump, it may be formed by embossing. A base tape 520 formed by embossing will be described below.

Figure 19:
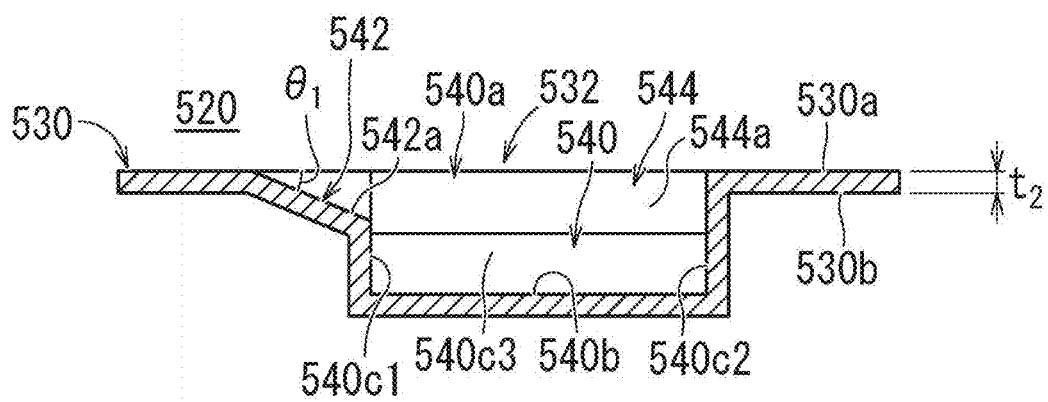
FIG. 19 is a diagram corresponding to FIG. 8, of a base tape according to a modification of another preferred embodiment of the present invention.
Figure 20:
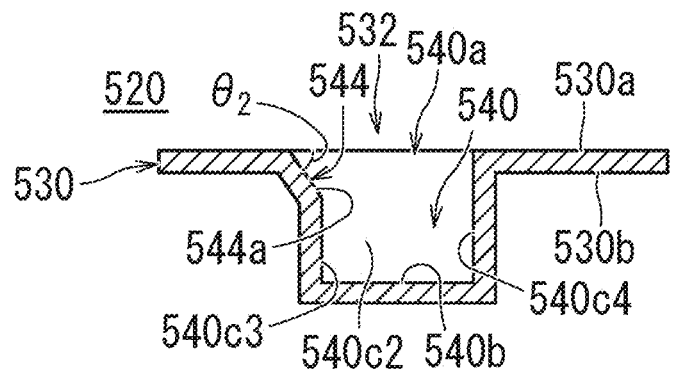
FIG. 20 is a diagram corresponding to FIG. 9, of the base tape according to the modification of another preferred embodiment of the present invention.

FIG. 19 is a diagram corresponding to FIG. 8, of a base tape according to a modification of another preferred embodiment of the present invention. FIG. 20 is a diagram corresponding to FIG. 9, of the base tape according to the modification of another preferred embodiment of the present invention.

A tape main body 530 of base tape 520 is similar in structure to base tape 20 except that a construction formed by embossing is different from the multi-layered structure including three or more layers of tape main body 30 of base tape 20, each layer being made of the multi-layered cardboard mainly including wood pulp, according to the first preferred embodiment. Therefore, elements identical or similar to those in base tape 20 are denoted by the same reference characters and description thereof will not be provided.

Base tape 520 accommodates a plurality of electronic components 14. Base tape 520 includes belt-shaped tape main body 530. Tape main body 530 includes a pair of main surfaces 530a and 530b opposed to each other and extending in the length direction. Tape main body 530 is preferably made of, for example, polystyrene, polycarbonate, polyethylene terephthalate, or polypropylene. A method of embossing is not particularly restricted, and for example, pressure forming, press-forming, or vacuum rotational forming (vacuum drum forming) may be used as appropriate. As the tape main body is made of a material as described above, an accommodation recess 540 is readily formed and an operation is able to be performed in a clean room.

Tape main body 530 preferably has a thickness $t_2$ not smaller than about 0.2 mm and not larger than about 0.3 mm, for example.

A component accommodation portion 532 is defined by accommodation recess 540, a first inclined portion 542 provided on one side of opposed sides in width direction Y of accommodation recess 540, and a second inclined portion 544 provided on one side of opposed sides in length direction Z of accommodation recess 540.

Accommodation recess 540 includes a rectangular or substantially rectangular opening 540a in one main surface 530a. Accommodation recess 540 includes a recess extending from one main surface 530a of tape main body 530 in a positive direction of height direction X and has a parallelepiped shape or substantially parallelepiped shape. Accommodation recess 540 has a size that allows accommodation of electronic component 14. More specifically, accommodation recess 540 is defined by a bottom surface 540b and four side surfaces 540c1, 540c2, 540c3, and 540c4. Side surfaces 540c1 and 540c2 are opposed to each other in width direction Y. Side surfaces 540c3 and 540c4 are opposed to each other in length direction Z.

A depth D of accommodation recess 540 refers to distance from one main surface 530a of tape main body 530 to bottom surface 540b of accommodation recess 540. Depth D of accommodation recess 540 is slightly larger than dimension T in the height direction of electronic component 14. A height of side surface 540c1 in accommodation recess 540 located on one side in width direction Y corresponds to a value calculated by subtracting a maximum value of depth $D_1$ of first inclined portion 542 from depth D of accommodation recess 540. A height of side surface 540c2 in accommodation recess 540 located on the other side in width direction Y is substantially equal to depth D of accommodation recess 540. A height of side surface 540c3 in accommodation recess 540 located on one side in length direction Z corresponds to a value calculated by subtracting a maximum value of depth $D_2$ of second inclined portion 544 from depth D of accommodation recess 540. A height of side surface 540c4 in accommodation recess 540 located on the other side in length direction Z is substantially equal to depth D of accommodation recess 540.

First inclined portion 542 guides electronic component 14 into accommodation recess 540. First inclined portion 542 includes a first inclined surface 542a and two side surfaces. The side surfaces are opposed to each other in length direction Z.

As shown in FIG. 19, first inclined portion 542 decreases in height toward side surface 540c1 on one side of opposed sides in width direction Y of four sides of opening 540a in accommodation recess 540 and from one main surface 530a of tape main body 530 toward the inside (toward bottom surface 540b) of accommodation recess 540. In other words, first inclined portion 542 increases in depth $D_1$ toward side surface 540c1 on one side in width direction Y of four sides of opening 540a in accommodation recess 540 and continues to side surface 540c1 of accommodation recess 540. A gradient of first inclined portion 542 is expressed with $\theta_1$. Gradient $\theta_1$ of first inclined portion 542 is an angle between first inclined surface 542a and one main surface 530a of tape main body 530. Gradient $\theta_1$ of first inclined portion 542 is similar in condition for gradient $\theta_1$ of first inclined portion 42 shown in FIG. 8.

Second inclined portion 544 includes a second inclined surface 544a and two side surfaces. The side surfaces are opposed to each other in width direction Y.

As shown in FIG. 20, second inclined portion 544 decreases in height toward side surface 540c3 on one side opposed in length direction Z of four sides of opening 540a in accommodation recess 540 and from one main surface 530a of tape main body 530 toward the inside (toward bottom surface 540b) of accommodation recess 540. In other words, second inclined portion 544 increases in depth $D_2$ toward side surface 540c3 on one side in length direction Z of four sides of opening 540a in accommodation recess 540 and continues to side surface 540c3 of accommodation recess 540. A gradient of second inclined portion 544 is expressed with $\theta_2$. Gradient $\theta_2$ of second inclined portion 544 is an angle between second inclined surface 544a and one main surface 530a of tape main body 530. Gradient $\theta_2$ of second inclined portion 544 is similar in condition for gradient $\theta_2$ of second inclined portion 544 shown in FIG. 9.

A maximum value of depth $D_1$ of first inclined portion 542 preferably satisfies a condition of $2 \times D_1 \leq D$, for example. A maximum value of depth $D_2$ of second inclined portion 544 preferably satisfies a condition of $2 \times D_2 \leq D$, for example. Depth $D_1$ of first inclined portion 542 and depth $D_2$ of second inclined portion 544 preferably satisfy a condition of $D_1 \leq D_2$, for example. Gradient $\theta_1$ of first inclined portion 542 and gradient $\theta_2$ of second inclined portion 544 preferably satisfy a condition of $\theta_1 \leq \theta_2$, for example.

Figure 21:
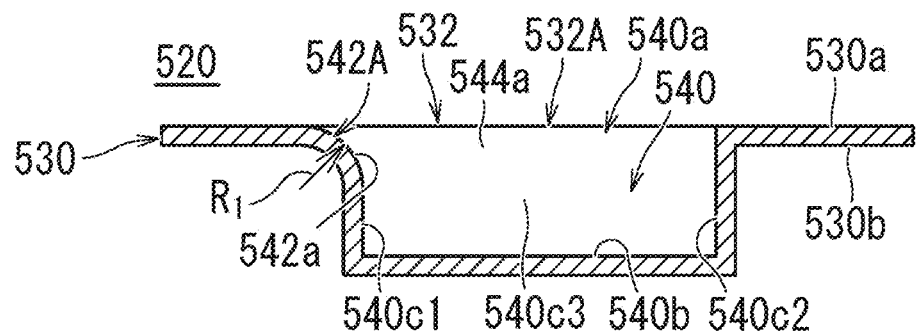
FIG. 21 is a diagram corresponding to FIG. 13, of a base tape according to a modification of another preferred embodiment of the present invention.
Figure 22:
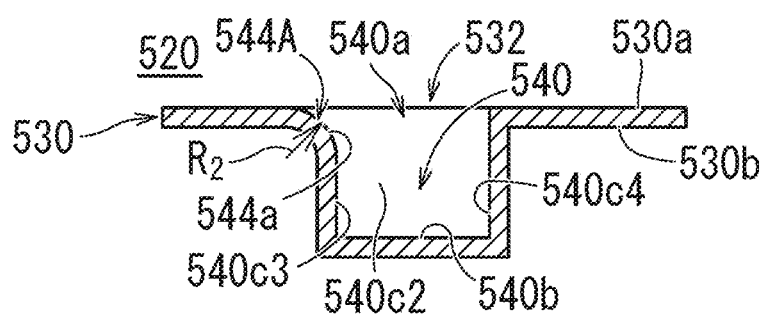
FIG. 22 is a diagram corresponding to FIG. 14, of the base tape according to the modification of another preferred embodiment of the present invention.

A modification of component accommodation portion 532 of base tape 520 formed by embossing described above will now be described. FIG. 21 is a diagram corresponding to FIG. 13, of a base tape according to the modification of another preferred embodiment of the present invention. FIG. 22 is a diagram corresponding to FIG. 14, of the base tape according to the modification of another preferred embodiment of the present invention.

A component accommodation portion 532A according to the modification of another preferred embodiment is defined by accommodation recess 540, a first inclined portion 542A provided on one side of opposed sides in width direction Y of accommodation recess 540, and a second inclined portion 544A provided on one side of opposed sides in length direction Z of accommodation recess 540.

First inclined portion 542A guides electronic component into accommodation recess 540. First inclined portion 542A includes a first inclined surface 542a and two side surfaces. The side surfaces are opposed to each other in length direction Z.

As shown in FIG. 21, first inclined portion 542A decreases in height toward side surface 540c1 on one side of opposed sides in width direction Y of four sides of opening 540a in accommodation recess 540 and from one main surface 530a of tape main body 530 toward the inside (toward bottom surface 540b) of accommodation recess 540. In other words, first inclined portion 542A increases in depth $D_1$ toward side surface 540c1 on one side in width direction Y of four sides of opening 540a in accommodation recess 540 and continues to side surface 540c1 of accommodation recess 540. First inclined surface 542a of first inclined portion 542A is a curved surface having radius of curvature $R_1$.

Second inclined portion 544A includes second inclined surface 544a and two side surfaces. The side surfaces are opposed to each other in width direction Y.

Second inclined portion 544A decreases in height toward side surface 540c3 on one side of opposed sides in length direction Z of four sides of opening 540a in accommodation recess 540 and from one main surface 530a of tape main body 530 toward the inside (toward bottom surface 540b) of accommodation recess 540. In other words, second inclined portion 544A increases in depth $D_2$ toward side surface 540c3 on one side in length direction Z of four sides of opening 540a in accommodation recess 540 and continues to side surface 540c3 of accommodation recess 540. Second inclined surface 544a of second inclined portion 544A is a curved surface having a radius of curvature $R_2$.

A relationship between radius of curvature $R_1$ of first inclined surface 542a and radius of curvature $R_2$ of second inclined surface 544a preferably satisfy a condition of $R_2 \leq R_1$, for example. A relationship among radius of curvature $R_1$ of first inclined surface 542a, radius of curvature $R_2$ of second inclined surface 544a, and depth D of accommodation recess 540 preferably satisfy a condition of $2 \times R_2 \leq 2 \times R_1 \leq D$, for example.

The structure of component accommodation portion 532 of tape main body 530 in base tape 520 formed by embossing according to the present preferred embodiment may be provided, and first inclined portion 542 and second inclined portion 544 may be continuous as in the structure of component accommodation portion 132 according to the second preferred embodiment. Specifically, first inclined surface 542a of first inclined portion 542 and second inclined surface 544a of second inclined portion 544 may be provided as being in direct contact with each other.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A base tape that accommodates a plurality of electronic components, the base tape comprising:
    a tape main body including a pair of main surfaces opposed to each other and extending in a length direction, with a longitudinal direction of the base tape being defined as the length direction and a direction of a short side being defined as a width direction, the tape main body including a plurality of component accommodation portions at a predetermined distance from each other in the length direction, each of the plurality of component accommodation portions defining and functioning as an accommodation area of the plurality of electronic components; wherein
    each of the component accommodation portions includes:
        an accommodation recess including a rectangular or substantially rectangular opening in one main surface of the tape main body;
        a first inclined portion located on a first side of opposed sides in the width direction, of four sides of the opening, the first inclined portion extending from the one main surface toward inside of the accommodation recess to become smaller in height than a second side of the opposed sides in the width direction; and
        a second inclined portion located on a first side of opposed sides in the length direction, the second inclined portion extending from the one main surface toward the inside of the accommodation recess to become smaller in height than a second side of the opposed sides in the length direction; and
    a magnitude of a gradient $\theta_1$ of the first inclined portion is smaller than a magnitude of a gradient $\theta_2$ of the second inclined portion.

2. The base tape according to claim 1, wherein the second inclined portion is provided on a side of a forward feed direction of the base tape, in the length direction of the accommodation recess.

3. The base tape according to claim 1, wherein a condition of $2 \times D_1 \leq D$ and $2 \times D_2 \leq D$ is satisfied, where a direction orthogonal or substantially orthogonal to the length direction and the width direction is defined as a height direction, and D represents a depth of the accommodation recess in the height direction, $D_1$ represents a depth of the first inclined portion in the height direction, and $D_2$ represents a depth of the second inclined portion in the height direction.

4. The base tape according to claim 3, wherein a condition of $D_1 \leq D_2$ is satisfied.

5. The base tape according to claim 1, wherein the first inclined portion and the second inclined portion are each in a shape of a curved surface.

6. A series of electronic components comprising:
    the base tape according to claim 1;
    an electronic component of the plurality of electronic components located in the accommodation recess; and
    a cover tape that covers a portion of the one main surface of the tape main body to close the opening in the accommodation recess where the electronic component is located.

7. The series of electronic components according to claim 6, wherein a condition of $W \leq T$ and $T \leq L$ is satisfied, where a dimension of the electronic component in the length direction is defined as a W dimension, a dimension of the electronic component in the width direction is defined as an L dimension, and a dimension of the electronic component in a height direction is defined as a T dimension.

8. The series of electronic components according to claim 6, wherein the electronic component is a multilayer ceramic capacitor.

9. The base tape according to claim 1, wherein each of the magnitude of the gradient $\theta_1$ of the first inclined portion and the magnitude of the gradient $\theta_2$ of the second inclined portion is between about five degrees and about seventy degrees.

10. The series of electronic components according to claim 7, wherein the L dimension is between about 0.2 mm and about 1.6 mm.

11. The base tape according to claim 1, wherein the tape main body has a thickness less than about 1.1 mm.

12. The base tape according to claim 1, wherein the tape main body has a thickness between about 0.2 mm and about 0.3 mm.

13. The series of electronic components according to claim 6, wherein the base tape further includes a plurality of feed holes located at a predetermined distance from each other in the length direction; and the cover tape does not cover at least one of the plurality of feed holes.

14. The series of electronic components according to claim 6, wherein the cover tape is transparent or semitransparent.

15. The base tape according to claim 1, wherein the tape main body has a multilayered structure including at least three layers.

16. The base tape according to claim 1, wherein the tape main body is made of a multi-layered cardboard.

17. The base tape according to claim 5, wherein a condition of $2 \times R_1 \leq D$ and $2 \times R_2 \leq D$ is satisfied, where a direction orthogonal or substantially orthogonal to the length direction and the width direction is defined as a height direction, and D represents a depth of the accommodation recess in the height direction, $R^1$ represents a radius of curvature of the first inclined surface, and $R^2$ represents a radius of curvature of the second inclined surface.

18. The base tape according to claim 17, wherein a condition of $R_2 \leq R_1$ is satisfied.

* * * * *